(12) United States Patent
Kanbe

(10) Patent No.: US 8,334,498 B2
(45) Date of Patent: Dec. 18, 2012

(54) SOLID-STATE IMAGING DEVICE, METHOD OF MANUFACTURING SOLID-STATE IMAGING DEVICE, METHOD OF DRIVING SOLID-STATE IMAGING DEVICE, AND ELECTRONIC APPARATUS

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 451 days.

(21) Appl. No.: 12/695,336

(22) Filed: Jan. 28, 2010

(65) Prior Publication Data
US 2010/0193670 A1    Aug. 5, 2010

(30) Foreign Application Priority Data

Feb. 5, 2009    (JP) .................................. 2009-025348

(51) Int. Cl.
*H01L 31/00*    (2006.01)
(52) U.S. Cl. ........... 250/214.1; 250/214 DC; 250/208.1; 257/431; 348/297; 348/302; 348/308
(58) Field of Classification Search ............... 250/214.1, 250/214 DC, 208.1; 257/231, 233, 239, 292, 257/431, 436, 461; 348/281–283, 297–299, 348/302–304, 307–308, 311
See application file for complete search history.

(56) References Cited

U.S. PATENT DOCUMENTS

| 7,728,277 B2 * | 6/2010 | Stevens et al. ............. 250/214.1 |
| 2010/0194959 A1 * | 8/2010 | Kanbe ........................... 348/311 |

FOREIGN PATENT DOCUMENTS

JP    2003-219281    7/2003

* cited by examiner

*Primary Examiner* — Francis M Legasse, Jr.
(74) *Attorney, Agent, or Firm* — SNR Denton US LLP

(57) ABSTRACT

A solid-state imaging device includes: a substrate; a substrate voltage supply applying a first potential to the substrate during a light receiving period including first and second exposure periods different from each other and applying a second potential to the substrate during a no-light receiving period; and a plurality of pixels each including: a light receiving portion formed on a front surface side of the substrate and generating a signal charge in accordance with received light; a storage capacitor formed adjacent to the light receiving portion so that the signal charge generated in the light receiving portion is transmitted thereto and is stored and held therein when the first potential is applied to the substrate; dark current suppressing portions; an electronic shutter adjusting layer; a reading gate portion; and a vertical transmission register transmitting the signal charge read by the reading gate portion in the vertical direction.

15 Claims, 11 Drawing Sheets

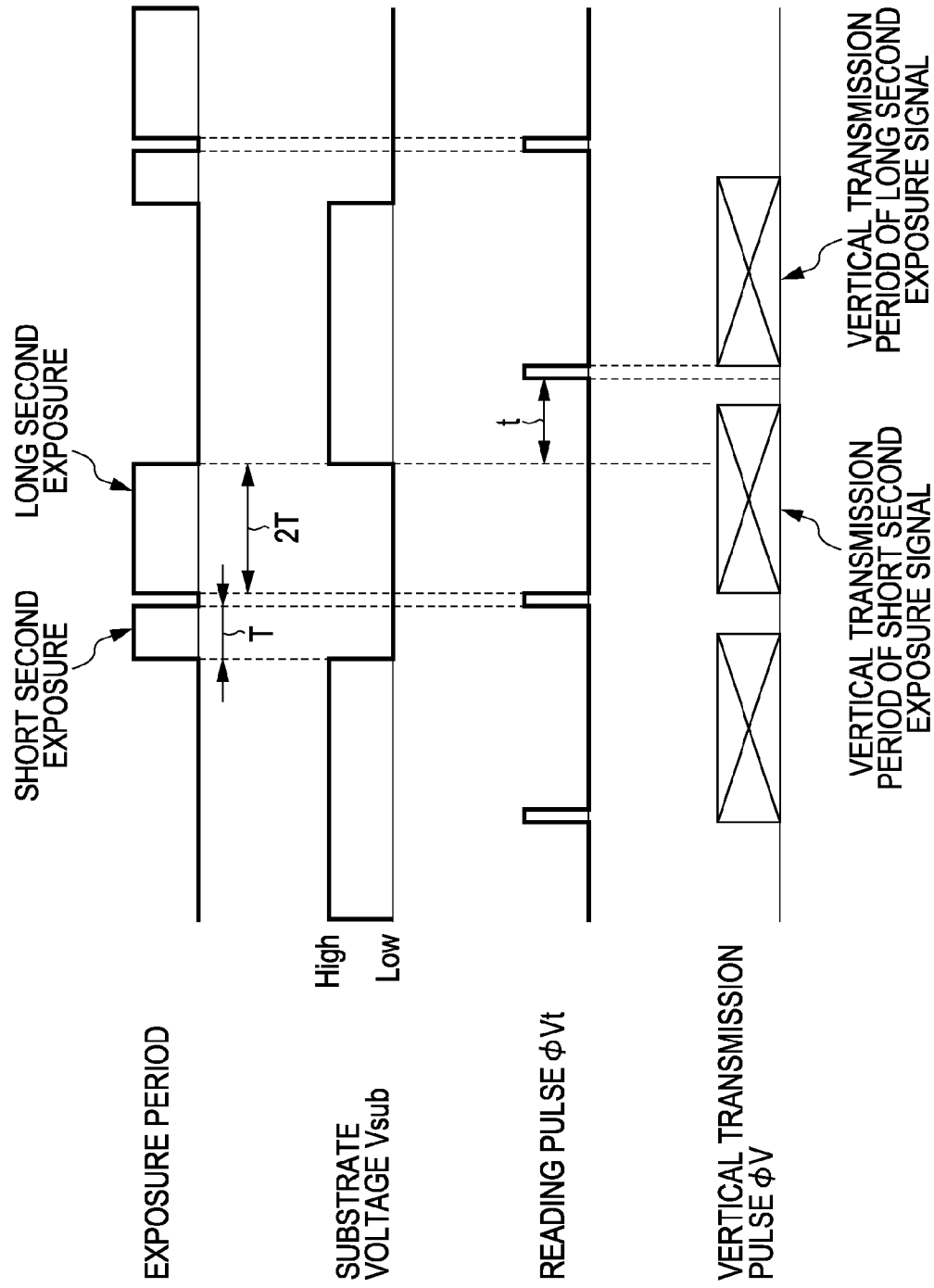

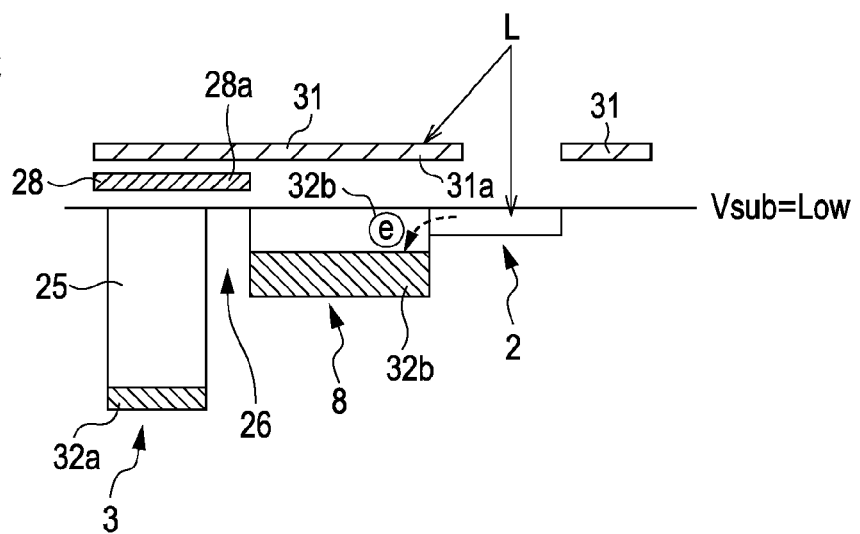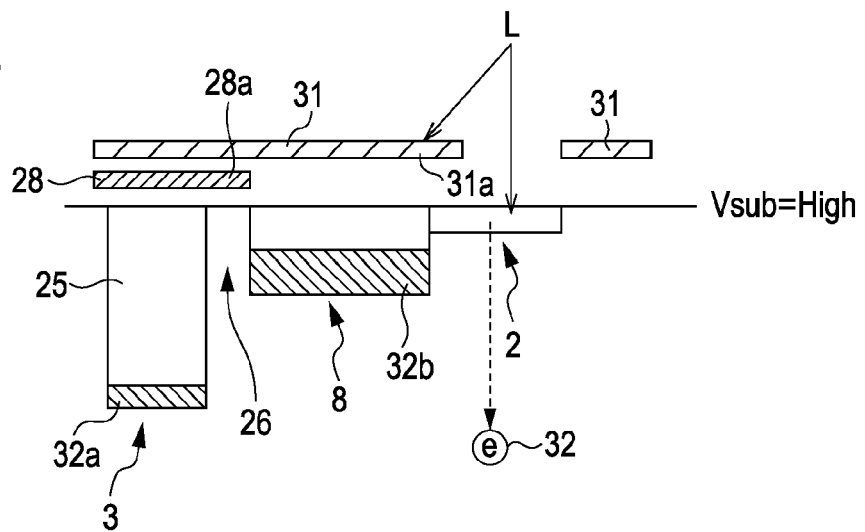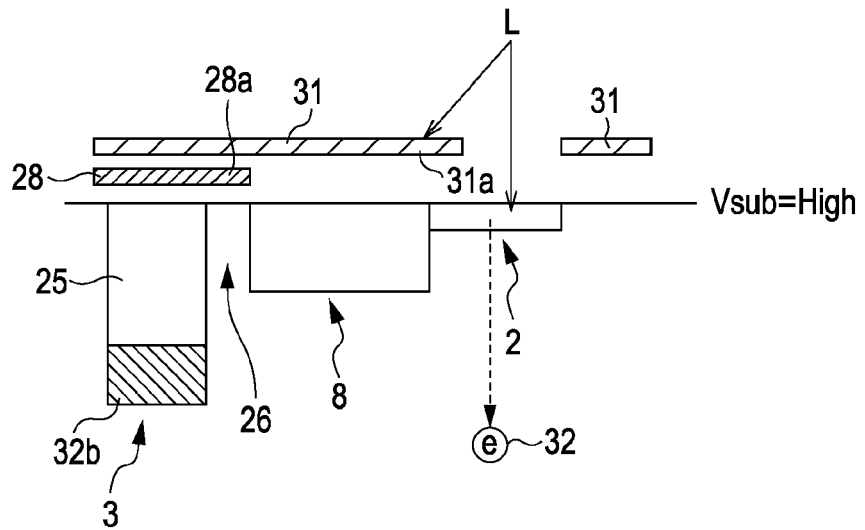

SOLID-STATE IMAGING DEVICE, METHOD OF MANUFACTURING SOLID-STATE IMAGING DEVICE, METHOD OF DRIVING SOLID-STATE IMAGING DEVICE, AND ELECTRONIC APPARATUS

BACKGROUND OF THE INVENTION

1. Field of the Invention

The present invention relates to a solid-state imaging device, and particularly, to a CCD (Charge Coupled Device) solid-state imaging device, a method of manufacturing a solid-state imaging device, and a method of driving a solid-state imaging device. In addition, the present invention relates to an electronic apparatus using the solid-state imaging device.

2. Description of the Related Art

For some time, in a solid-state imaging device, various methods have been contrived in order to realize an imaging function having a wide dynamic range. As a method widely used among them, Japanese Unexamined Patent Application Publication No. 2003-219281 discloses a method of obtaining a wide dynamic range of signals in such a manner that a short second exposure and a long second exposure are performed, and a low sensitive signal and a high sensitive signal having different exposure periods are combined with each other using a calculation.

FIG. 11 shows a driving timing chart of a solid-state imaging device of the related art which uses plural signals having different exposure periods. The timing chart shown in FIG. 11 is the timing chart applied to a CCD-type solid-state imaging device in which a transmission type is an IT (Interline Transfer) type, and a reading type is an entire pixel reading type.

As shown in FIG. 11, the short second exposure is started by the application of the substrate shutter pulse (a in FIG. 11). The signal charge generated by the short second exposure is read to the vertical CCD by the application of the reading pulse (b in FIG. 11). Subsequently, in the vertical CCD, the signal charge obtained by the short second exposure is transmitted in the vertical direction by the vertical transmission pulse (c in FIG. 11). During a period in which the signal charge generated by the short second exposure is transmitted in the vertical CCD, the long second exposure is started by the application of the substrate shutter pulse (d in FIG. 11). Subsequently, after the signal charge generated by the short second exposure is completely transmitted by the vertical CCD, the signal charge generated by the long second exposure is read to the vertical CCD by the application of the reading pulse (e in FIG. 11), and is transmitted in the vertical direction by the vertical transmission pulse (f in FIG. 11).

However, in an operation of driving the solid-state imaging device of the related art, in the case where the long second exposure is shorter than the field period, the end of the long second exposure is determined by the timing of the reading pulse indicated by e in FIG. 11. That is, since it is possible to read the signal charge generated by the long second exposure by using the vertical CCD after the signal charge generated by the short second exposure is completely transmitted in the vertical CCD, the position of the timing of the reading pulse indicated by e in FIG. 11 is fixed.

For this reason, the start of the long second exposure is determined by the substrate shutter pulse. However, after the short second exposure, the substrate shutter pulse is applied in accordance with the reading pulse indicated by e in FIG. 11, and the long second exposure is started as indicated by d in FIG. 11. Accordingly, a time interval exists between the short second exposure and the long second exposure. In this case, it is not desirable to capture an image of a moving object due to a problem in calculation. That is, the time interval between the short second exposure and the long second exposure causes a problem in calculating a wide dynamic range of signals from a moving object.

SUMMARY OF THE INVENTION

Therefore, it is desirable to provide a CCD-type solid-state imaging device, a method of manufacturing a solid-state imaging device, and a method of driving a solid-state imaging device capable of shortening a time interval between a short second exposure and a long second exposure and appropriately obtaining a wide dynamic range. It is also desirable to provide an electronic apparatus using the solid-state imaging device.

A solid-state imaging device according to an embodiment of the invention is an entire-pixel-type imaging element including a substrate and a substrate voltage supply applying a potential to the substrate during a light receiving period including first and second exposure periods different from each other and applying a potential to the substrate during a no-light receiving period. The substrate is provided with a plurality of pixels each including a light receiving portion, a storage capacitor, dark current suppressing portions, a reading gate portion, and a vertical transmission register.

The light receiving portion is formed on a front surface side of the substrate and generates a signal charge in accordance with received light. The storage capacitor is formed in a region adjacent to the light receiving portion so that the signal charge generated in the light receiving portion is transmitted thereto and is stored and held therein when a first potential is applied to the substrate.

The dark current suppressing portions are formed in the light receiving portion and the storage capacitor.

An electronic shutter adjusting layer is a layer formed in a region facing the light receiving portion in the substrate and distant from the storage capacitor by a predetermined offset region. In addition, the electronic shutter adjusting layer is a layer adjusting a potential distribution of the substrate so that the signal charge generated in the light receiving portion is swept toward a rear surface side of the substrate when a second potential is applied to the substrate.

The reading gate portion reads the signal charge stored in the storage capacitor after the first and second exposure periods.

The vertical transmission register transmits the signal charge read by the reading gate portion in the vertical direction.

A method of manufacturing a solid-state imaging device according to an embodiment of the invention includes the steps of: preparing a first conduction type semiconductor substrate; and forming a second conduction type semiconductor well layer on the semiconductor substrate. The method further includes the step of forming a light receiving portion, a storage capacitor adjacent to the light receiving portion, and a vertical transmission channel adjacent to the storage capacitor through a reading gate portion on a front surface side of the semiconductor well layer. The method further includes the step of forming a first conduction type electronic shutter adjusting layer in a region facing the light receiving portion between the semiconductor substrate and the semiconductor well layer and distant from the storage capacitor by a desired offset region before or after forming the semiconductor well layer. The method further includes the step of forming dark current suppressing portions in light-incident-side upper portions of the storage capacitor and the light receiving portion.

The method further includes the step of connecting the substrate to a substrate voltage supply applying different potentials during a light receiving period and a no-light receiving period. The method further includes the step of forming an electrode wiring, applying a reading pulse after a first exposure period and a second exposure period having a different exposure period from that of the first exposure period, by forming a reading electrode in an upper portion of the reading channel.

A method of driving a solid-state imaging device according to an embodiment of the invention includes the step of applying a first potential from the substrate voltage supply to the substrate so that the signal charge generated in the light receiving portion starts to be transmitted to the storage capacitor in the above-described solid-state imaging device. The method further includes the step of applying a second potential from the substrate voltage supply to the semiconductor substrate so that the transmission of the signal charged generated in the light receiving portion to the storage capacitor ends, and the signal charge generated in the light receiving portion is swept toward the rear surface side of the substrate.

In the solid-state imaging device and the method of driving the same according to the embodiments of the invention, the signal charge is not stored in the light receiving portion, and is occasionally transmitted to the storage capacitor or is swept toward the substrate. In addition, when the substrate voltage is changed, the signal charge generated in the light receiving portion is discharged and transmitted to the storage capacitor or is swept toward the substrate.

An electronic apparatus according to an embodiment of the invention includes an optical lens, a solid-state imaging device, and a signal processing circuit. The electronic apparatus according to the embodiment of the invention adopts the solid-state imaging device according to the embodiment of the invention.

According to the embodiments of the invention, it is possible to obtain the solid-state imaging device capable of obtaining a high-quality image having a wide dynamic range even when the image of the moving object is captured by shortening the time interval between the short second exposure and the long second exposure.

BRIEF DESCRIPTION OF THE DRAWINGS

FIG. 6 is a driving timing chart of the solid-state imaging device according to the first embodiment of the invention.

FIGS. 8C to 8E are (second) diagrams showing a case where a signal charge is transmitted upon driving the solid-state imaging device according to the first embodiment of the invention.

DESCRIPTION OF THE PREFERRED EMBODIMENTS

Figure 1:
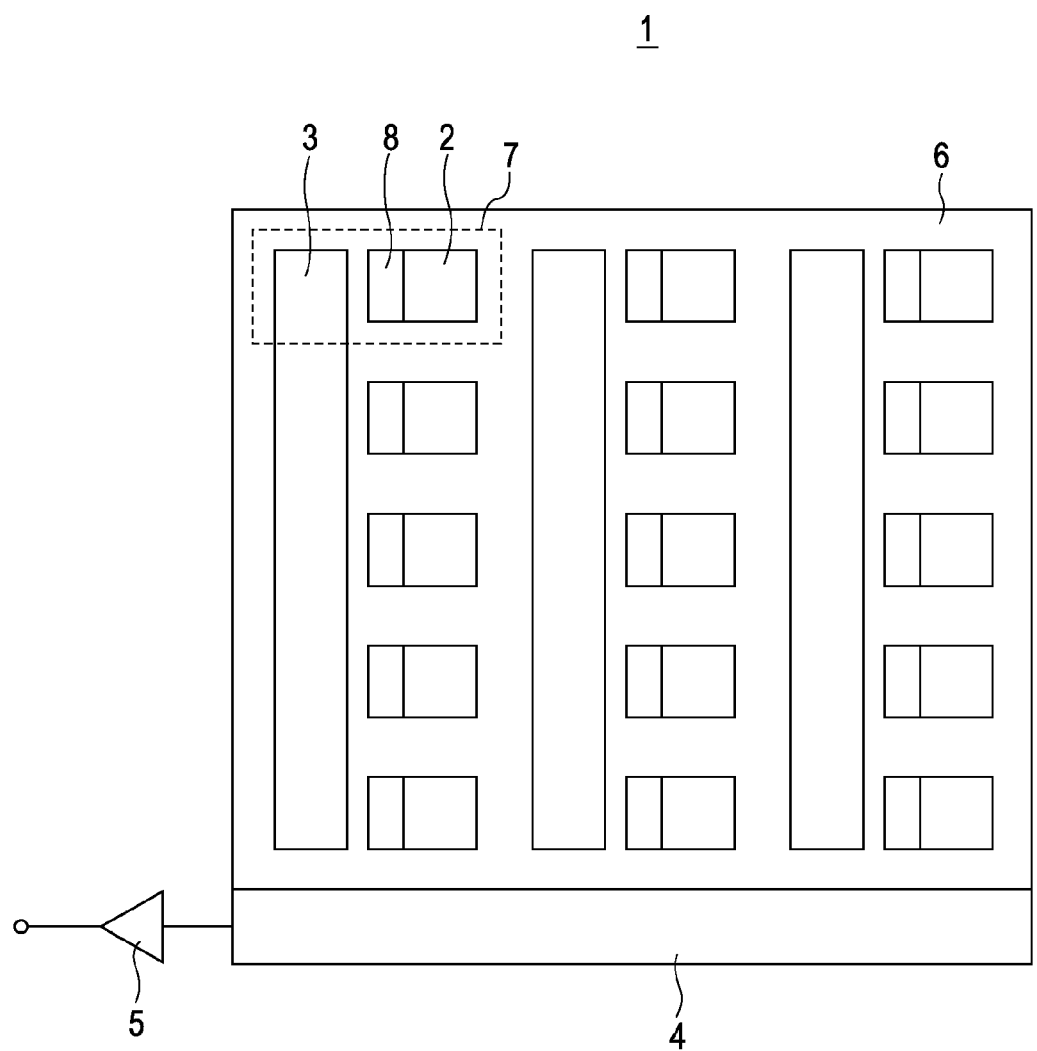
FIG. 1 is a schematic configuration diagram of a solid-state imaging device according to a first embodiment of the invention.

Details of a solid-state imaging device, a method of manufacturing a solid-state imaging device, a method of driving a solid-state imaging device, and an electronic apparatus according to embodiments of the invention will be hereinafter described with reference to FIGS. 1 to 10. The invention will be hereinafter described in order of the following items. In addition, the invention is not limited to the following examples.
1. First Embodiment: example of solid-state imaging device
   1.1 Entire configuration of solid-state imaging device
   1.2 Sectional configuration of solid-state imaging device
   1.3 Method of manufacturing solid-state imaging device
   1.4 Method of driving solid-state imaging device
2. Second Embodiment: example of solid-state imaging device
3. Third Embodiment: example of electronic apparatus
1. First Embodiment
1.1 Entire Configuration of Solid-State Imaging Device FIG. 1 is a schematic configuration diagram of a CCD-type solid-state imaging device according to a first embodiment of the invention. As shown in FIG. 1, a solid-state imaging device 1 according to this embodiment includes plural light receiving portions 2 which are formed on a substrate 6, storage capacitors 8 which are respectively formed to be adjacent to the light receiving portions 2, vertical transmission registers 3, and a horizontal transmission register 4. In addition, a unit pixel 7 includes one light receiving portion 2, the storage capacitor 8, and the vertical transmission register 3 adjacent to the storage capacitor 8. In this embodiment, a transmission type of the solid-state imaging device 1 is an IT (Interline Transfer) type in which a transmission portion including the light receiving portion 2 and the vertical transmission register 3 is separately formed, and a reading type thereof is an entire pixel reading type in which all pixels are simultaneously read.

The light receiving portion 2 includes a photoelectric conversion element, that is, a photo diode, and generates a signal charge. In this embodiment, plural light receiving portions 2 are formed on the substrate 6 in the horizontal and vertical directions so as to have a matrix shape.

Each of the storage capacitors 8 is formed to be adjacent to each of the light receiving portions 2, and stores a signal charge generated by the light receiving portion 2.

Each of the vertical transmission register 3 is configured to have a CCD structure, and is vertically provided for each of the light receiving portions 2 and the storage capacitors 8 arranged in the vertical direction. The vertical transmission register 3 reads a signal charge stored in the storage capacitor 8, and transmits the signal charge in the vertical direction. In this embodiment, a transmission stage having the vertical transmission register 3 formed thereon is configured to be driven in, for example, four-phase modes by a transmission driving pulse applied from a transmission driving pulse circuit (not shown). In addition, in a final stage of the vertical transmission register 3, when the transmission driving pulse is applied, the signal charge stored in the final stage is transmitted to the horizontal transmission register 4. The vertical transmission register is capable of reading all pixels, that is, the vertical transmission register is capable of simultaneously transmitting pixel signals for all pixels. That is, the vertical transmission register includes one bit of a transmission mechanism for one pixel.

The horizontal transmission register 4 is formed to have a CCD structure, and is formed in one end of the final stage of the vertical transmission register 3. The transmission stage having the horizontal transmission register 4 formed thereon horizontally transmits the signal charge vertically transmitted by the vertical transmission register 3 every horizontal line.

An output circuit 5 outputs the signal charge horizontally transmitted by the horizontal transmission register 4 as an image signal through a charge voltage conversion.

In the solid-state imaging device 1 having the above-described configuration, the signal charge stored in the light receiving portion 2 is vertically transmitted by the vertical transmission register 3, and is transmitted to the inside of the horizontal transmission register 4. Then, in the signal charge transmitted to the inside of the horizontal transmission register 4, the signal charge inside the horizontal transmission register 4 is transmitted in the horizontal direction, and is output as an image signal through the output circuit 5.

1.2 Sectional Configuration of Solid-State Imaging Device

Figure 2:
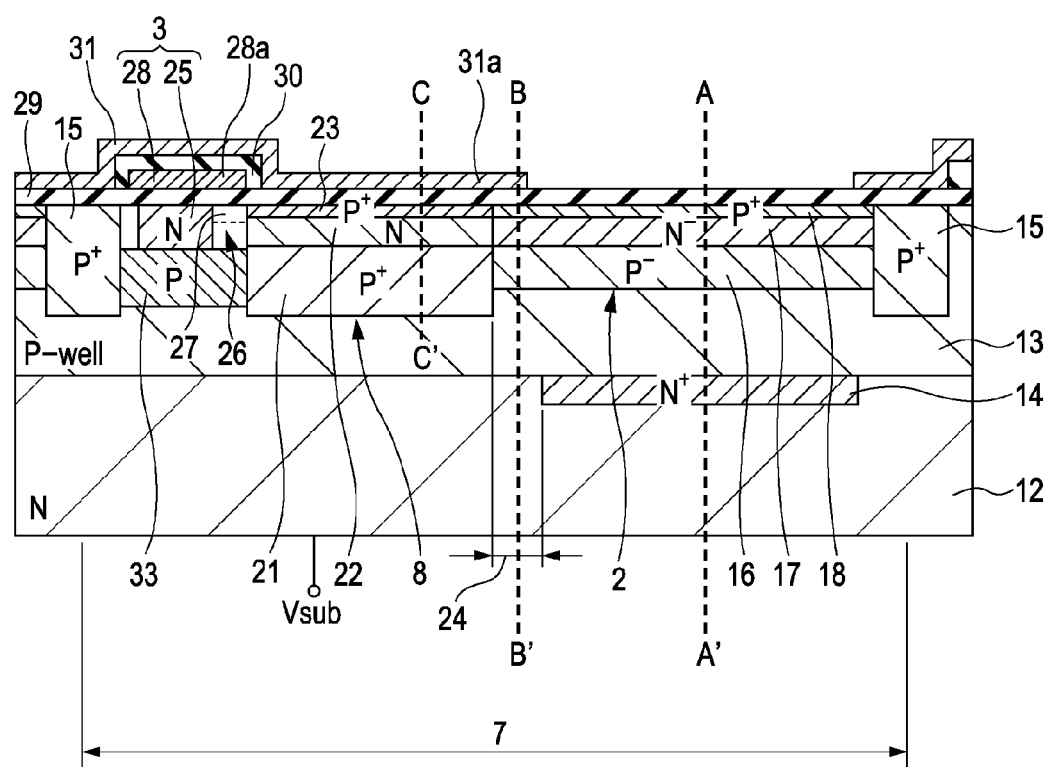
FIG. 2 is a schematic sectional configuration diagram of the solid-state imaging device according to the first embodiment of the invention.

FIG. 2 shows a schematic sectional configuration for one pixel in the solid-state imaging device 1 according to this embodiment. In this embodiment of the invention, a first conduction type is set to an N type, and a second conduction type is set to a P type.

The solid-state imaging device 1 according to this embodiment includes a semiconductor substrate 12, a semiconductor well layer 13, and a substrate voltage supply (not shown). In addition, the semiconductor well layer 13 includes the light receiving portion 2 constituting the pixel 7, the storage capacitor 8, a reading gate portion 26, the vertical transmission register 3, an electronic shutter adjusting layer 14, and first and second dark current suppressing portions 18 and 23.

The semiconductor substrate 12 is formed by, for example, an N-type CZ substrate formed of silicon. In addition, the semiconductor substrate 12 is connected to a substrate voltage supply (not shown). The substrate voltage supply supplies different substrate voltages Vsub to the semiconductor substrate 12 during a period in which light is received by the light receiving portion 2, a period in which the signal charge is read from the storage capacitor 8 to the vertical transmission register 3, and a period in which the signal charge is transmitted by the vertical transmission register 3. The substrate voltage supply may be provided outside the element, but may be provided inside the solid-state imaging device 1 as a substrate voltage generating circuit.

The semiconductor well layer 13 is formed by a P$^-$-type epitaxial layer formed on the semiconductor substrate 12. In this embodiment, in the semiconductor well layer 13, a surface opposite to a surface facing the semiconductor substrate 12 is set to a light receiving surface.

The light receiving portion 2 includes an N-type low-concentration impurity region (N$^-$ region) 17 and a P-type low-concentration impurity region (P$^-$ region) 16. The N$^-$ region 17 is formed on the light receiving surface of the semiconductor well layer 13. The P$^-$ region 16 is formed on a region opposite to the light receiving surface with respect to the N$^-$ region 17 so as to contact with the N$^-$ region. That is, the light receiving portion 2 according to this embodiment is formed by a photo diode which includes the connection face of the upper dark current suppressing portion 18 to be described later, the lower P$^-$ region 16, and the N$^-$ region 17. In the light receiving portion 2, light incident from the light receiving surface is subjected to a photoelectric conversion by the connection face so as to generate a signal charge in accordance with the light intensity.

The storage capacitor 8 includes an N-type impurity region (N region) 22 and a P-type high concentration impurity region (P$^+$ region) 21, and is formed to be adjacent to the light receiving portion 2 formed on the semiconductor well layer 13. The N region 22 is formed in a region located on the side of the light receiving surface of the semiconductor well layer 13 and adjacent to the N$^-$ region 17 constituting the light receiving portion 2 in the horizontal direction. The P$^+$ region 21 is formed in a region on the opposite side of the light receiving surface with respect to the N region 22 so as to contact with the N region 22. That is, the potential well is formed by connecting the N region 22, the upper dark current suppressing portion 23 to be described later, and the lower P$^+$ region 21 with each other. The signal charge generated by the light receiving portion 2 is stored in the N region 22. Here, the electrostatic potential of the storage capacitor 8 is deeper than that of the light receiving portion 2.

The first dark current suppressing portion 18 is formed on the outermost surface of the light receiving surface of the light receiving portion 2 formed in the semiconductor well layer 13. In addition, the second dark current suppressing portion 23 is formed on the outermost surface of the light receiving surface of the storage capacitor 8. The first and second dark current suppressing portions 18 and 23 are formed by the P-type high concentration impurity region, and are integrally formed with each other from the light receiving portion 2 to the storage capacitor 8. In the first and second dark current suppressing portions 18 and 23, dark current generated in a boundary face of the light receiving surface is suppressed by plural electron holes as carriers in the P-type high concentration impurity region. That is, in the light receiving portion 2 and the storage capacitor 8 according to this embodiment, a HAD (Hole-Accumulation Diode HAD: trademark) structure, that is, a so-called embedded photo diode is formed.

The electronic shutter adjusting layer 14 is formed in a region of the semiconductor substrate 12 contacting with the semiconductor well layer 13 and facing the light receiving portion 2 by the N-type high concentration impurity region. In addition, the electronic shutter adjusting layer 14 is formed at a position which is distant in the horizontal direction by a predetermined offset region 24 from the region having the storage capacitor 8 toward the light receiving portion 2. As described below, the offset region 24 is determined so that the potential distribution of the semiconductor substrate 12 and the semiconductor well layer 13 are optimized.

The reading gate portion 26 includes a reading channel 27 and a reading electrode 28a. The reading channel 27 is formed in a region adjacent to the storage capacitor 8 formed on the surface of the semiconductor well layer 13 by the P-type or N-type low-concentration impurity region. In addition, the reading electrode 28a is formed on the upper portion of the reading channel 27 through a gate insulation layer 29.

The vertical transmission register 3 includes a vertical transmission channel 25 and a vertical transmission electrode 28. The vertical transmission channel 25 is formed in a region adjacent to the reading channel 27 by the N-type impurity region. A transmission portion semiconductor well layer 33 is formed below the vertical transmission channel 25 by the P-type impurity region.

The vertical transmission electrode 28 is formed on the upper portion of the vertical transmission channel 25, formed on the semiconductor well layer 13, with a gate insulation layer 29 interposed therebetween. Although it is not shown in the drawing, plural lines of vertical transmission electrodes 28 are formed in the horizontal direction, and a portion thereof adjacent to the storage capacitor 8 also serves as the reading electrode 28a. In the vertical transmission register 3, the signal charge read to the vertical transmission channel 25 by the reading gate portion 26 is vertically transmitted to plural lines of vertical transmission electrodes 28 formed in the horizontal direction, for example, by the application of four phases of vertical transmission pulses.

In this embodiment, the gate insulation layer 29 is commonly formed on the entire surface on the semiconductor well layer 13. In addition, in a region surrounding the light receiving portion 2, the storage capacitor 8, and the vertical transmission register 3 constituting the pixel 7, a channel stop portion 15 dividing the adjacent pixels includes the P-type high concentration impurity region.

A light shielding layer 31 is formed so as to cover an upper surface of the semiconductor well layer 13 including an electrode such as the vertical transmission electrode 28 excluding an opening region of the light receiving portion 2 with an interlayer insulation layer 30 interposed therebetween. That is, the reading gate portion 26 or the vertical transmission register 3 is covered by the light shielding layer 31. At this time, the end of the light shielding layer 31 above the storage capacitor 8 is formed to have a protrusion 31a which protrudes by a predetermined region toward the light receiving portion 2.

Next, a potential profile of the solid-state imaging device 1 according to this embodiment will be described with reference to FIG. 3A. In the following description, in the case where the semiconductor 12 and the semiconductor well layer 13 are not distinguished from each other, the semiconductor 12 and the semiconductor well layer 13 are generally referred to as a "substrate".

Figure 3A:
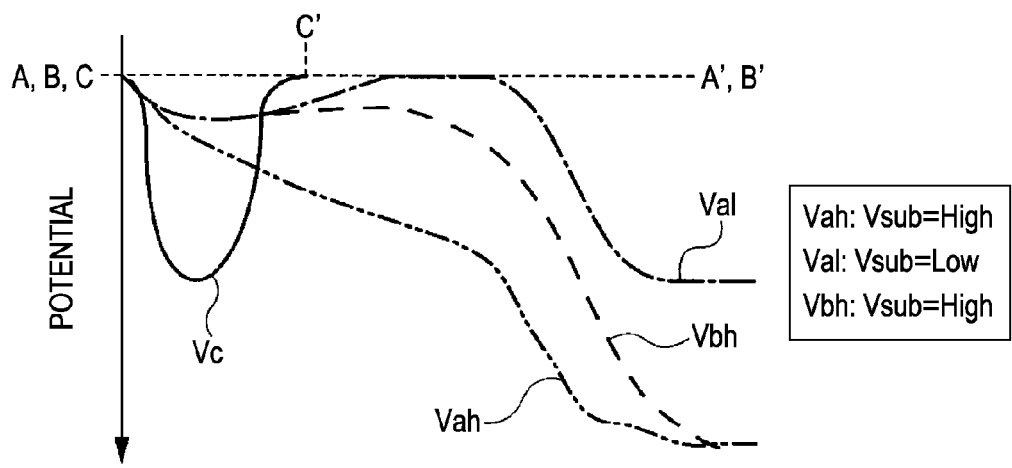
FIGS. 3A and 3B are graphs of a potential of a substrate of the solid-state imaging device according to the first embodiment of the invention.

FIG. 3A is a potential distribution showing the potential of the substrate taken along the line A-A', B-B', and C-C' of FIG. 2. The line A-A' indicates the potential distribution in the vertical direction of the substrate including the light receiving portion 2 and the electronic shutter adjusting layer 14, and the line B-B' indicates the potential distribution in the vertical direction of the substrate including the light receiving portion 2 and the offset region 24. In addition, the line C-C' indicates the potential distribution in the vertical direction of the substrate including the storage capacitor 8.

The dashed-dotted line shown in FIG. 3A indicates a potential Val taken along the line A-A' when the substrate voltage Vsub is set to a first potential (hereinafter, Low). In addition, the dashed-two dotted line shown in FIG. 3A indicates a potential Vah taken along the line A-A' when the substrate voltage Vsub is set to a second potential (hereinafter, High) higher than the first potential. In addition, the dashed line shown in FIG. 3A indicates a potential Vbh taken along the line B-B' when the substrate voltage Vsub is set to High. Further, the dashed line shown in FIG. 3A indicates a potential Vc of the storage capacitor 8 taken along the line C-C'.

As shown in FIG. 3A, in the case where the substrate voltage Vsub is set to Low, the potential Val taken along the line A-A' is deeper than that of the P$^-$ region 16 or the semiconductor well layer 13 in the N$^-$ region 17 constituting the light receiving portion 2. That is, in the N$^-$ region 17 of the light receiving portion 2, a well of a shallow potential is formed. The concentration of the impurity of the N$^-$ region 17 is set to a potential shallower by about 1 V than that of the light receiving portion having a general HAD structure used in the related art.

Figure 3B:
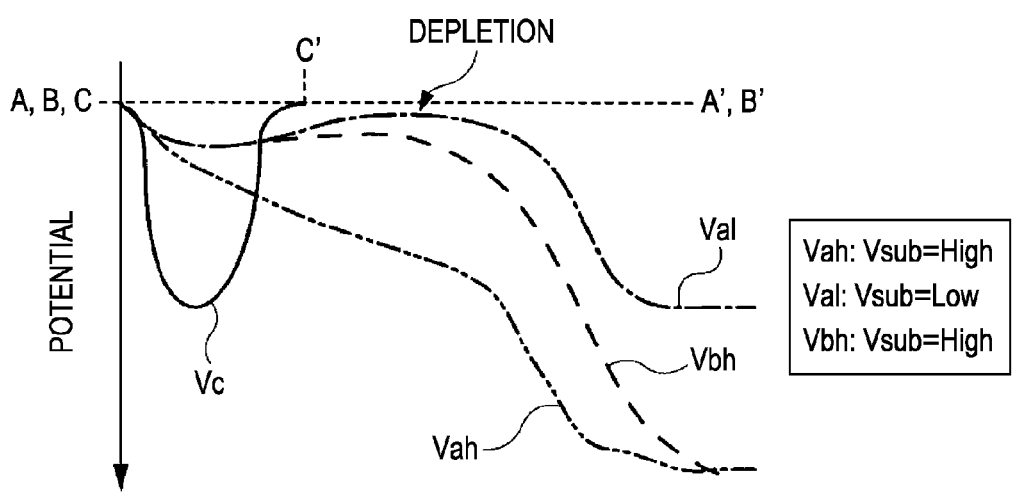

In addition, in the case where the substrate voltage Vsub is Low, although it is not shown in the drawing, the potential taken along the line B-B' is equal to the potential Val taken along the line A-A'. In FIG. 3A, the potential of the semiconductor well layer 13 below the P$^-$ region 16 constituting the light receiving portion 2 is depicted as a partially neutral (non-depleted) state, but may be depleted. However, in a CCD-type solid-state imaging device of an overflow drain type, in order to make the signal charge to overflow toward the substrate by the depletion, the depletion is performed as shown in FIG. 3B. In the case of the neutral, excessive charge is diffused by excessive light in the transverse direction, and flows into the vertical transmission register, which may cause a so-called blooming image. For this reason, it is desirable that the potential of the semiconductor well layer 13 below the P$^-$ region 16 is depleted.

Next, in the case where the substrate voltage Vsub is set to High, the potential Vah taken along the line A-A' is pulled toward a deep side as a whole by the effect of the electronic shutter adjusting layer 14 formed by the N-type high concentration impurity region. In addition, the potential Vah changes so as to be deep toward the semiconductor substrate 12. In addition, in the line B-B', since the electronic shutter adjusting layer 14 is not formed by the offset region 24, the potential is just slightly deep toward the semiconductor substrate 12, and hence the potential Vbh in the vicinity of the light receiving portion 2 is substantially maintained to a value when the substrate voltage Vsub is Low.

In addition, the potential Vc taken along the line C-C' forms a well having a potential deeper than that of the light receiving portion 2 by the effect of the connection face between the N region 22 constituting the storage capacitor 8, the P' region 21 having a comparatively high concentration of impurities, and the second dark current suppressing portion 23. With such a configuration, the second dark current suppressing portion 23 has a zero potential, and the potential of the N region 22 is pulled up to be shallower in the surface direction. Even in the electric capacity, since there are upper and lower P+ regions (the second dark current suppressing portion 23 and the P$^+$ region 21) with respect to the N region 22, the electric capacity is a sum of two capacities, and hence the electric capacity increases.

1.3 Method of Manufacturing Solid-State Imaging Device

Figure 4A:
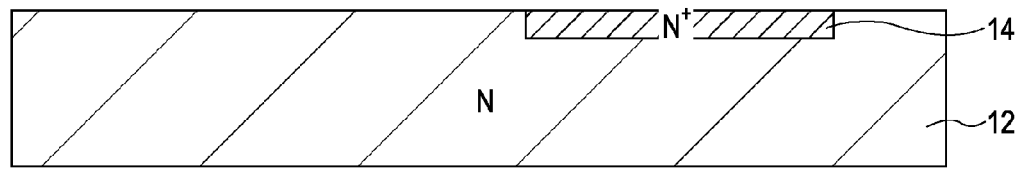
FIGS. 4A to 4C are (first) manufacturing process diagrams of the solid-state imaging device according to the first embodiment of the invention.
Figure 4B:
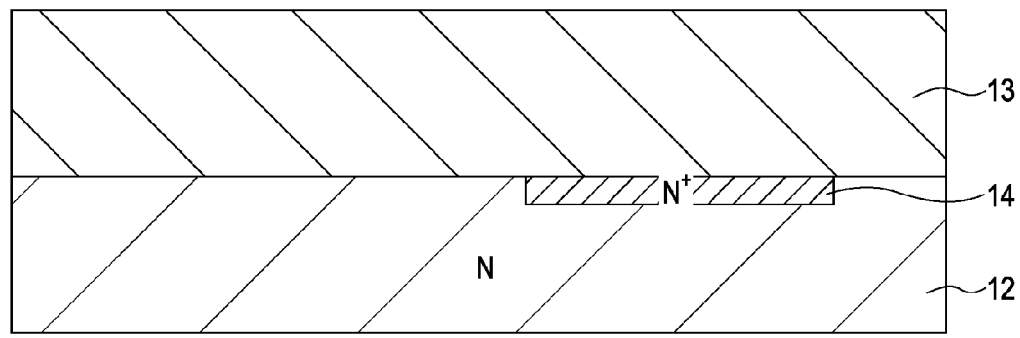
Figure 4C:
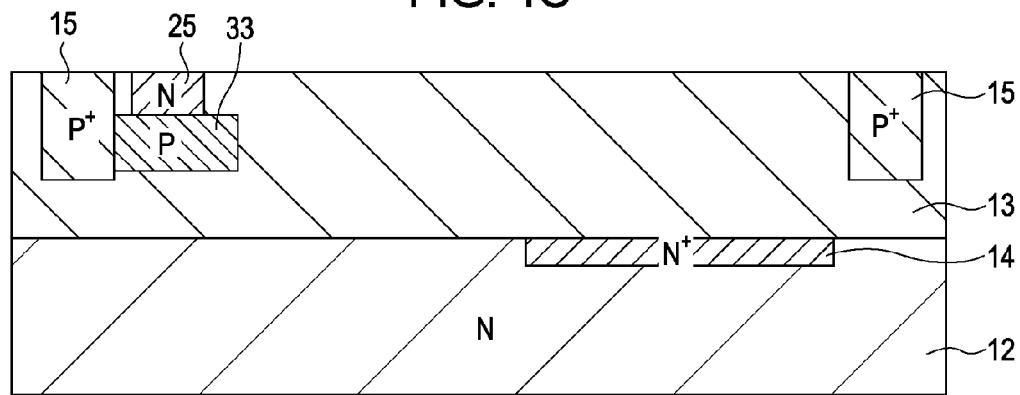

A method of manufacturing the solid-state imaging device having the above-described configuration will be described with reference to FIGS. 4A to 4C and 5D and 5E. In FIGS. 4A to 4C, the same reference numerals will be given to the same constituents as those in FIG. 2, and the description thereof will be omitted.

First, as shown in FIG. 4A, for example, the N-type semiconductor substrate 12 such as a CZ substrate is prepared, and a high concentration of N-type impurities is injected to a predetermined position on the semiconductor substrate 12 through ion injection, thereby forming the electronic shutter adjusting layer 14.

Next, as shown in FIG. 4B, the semiconductor well layer 13 including the P$^-$-type epitaxial layer is formed by epitaxy.

Next, as shown in FIG. 4C, the P-type impurities are injected by a predetermined depth through ion injection to a region of the semiconductor well layer 13 having the vertical transmission register 3 formed thereon, thereby forming the transmission portion semiconductor well layer 33. The N-type impurities are injected through ion injection to a predetermined region on the transmission portion semiconductor well layer 33, thereby forming the vertical transmission channel 25. In addition, the P-type impurities are injected through ion injection to a region adjacent to the vertical transmission channel 25, thereby forming the cannel stop portion 15.

Figure 5D:
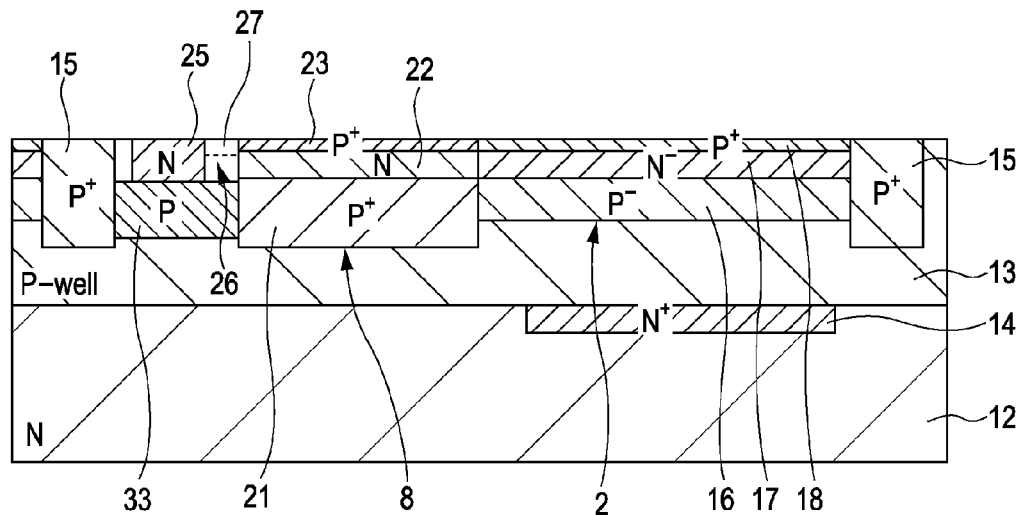
FIGS. 5D and 5E are (second) manufacturing process diagrams of the solid-state imaging device according to the first embodiment of the invention.

Next, as shown in FIG. 5D, a low concentration of P-type impurities and N-type impurities is injected through ion injection to a predetermined position of the surface of the semiconductor well layer 13, thereby forming the light receiving portion 2 including the P⁻ region 16 and the N⁻ region 17. In addition, a high concentration of P-type impurities and N-type impurities is injected through ion injection to a predetermined position of the surface of the semiconductor well layer 13, thereby forming the storage capacitor 8 including the P⁺ region 21 and the N region 22. Then, the P-type high concentration impurities are injected through ion injection to the outermost surface of the semiconductor well layer 13 having the storage capacitor 8 and the light receiving portion 2 formed thereon, thereby forming the first and second dark current suppressing portions 18 and 23. In addition, a region between the region having the storage capacitor 8 and the region having the vertical transmission channel 25 is formed as the reading channel 27 constituting the reading gate portion 26.

Figure 5E:
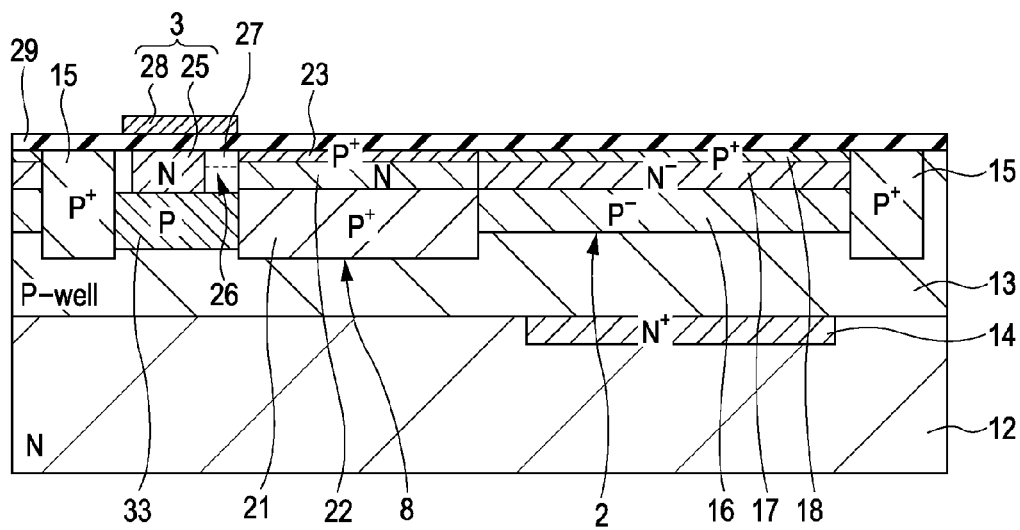

Next, as shown in FIG. 5E, the gate insulation layer 29 is formed on the upper portion of the semiconductor well layer 13, and the vertical transmission electrode 28 is formed on the gate insulation layer 29. Plural lines of the vertical transmission electrodes 28 are formed on the upper portion of the vertical transmission channel 25 in the horizontal direction. In addition, as shown in FIG. 5E, the vertical transmission electrode 28 on the upper portion of the vertical transmission channel 25 adjacent to the reading channel 27 extends to the upper portion of the reading channel 27. Accordingly, the vertical transmission electrode 28 also serves as the reading electrode 28a.

In addition, after a desired electrode is formed, the light shielding layer 31 is formed in a region, excluding the light receiving portion 2, with the interlayer insulation layer 30 interposed therebetween. The light shielding layer 31 may also serve as a desired wiring layer. In addition, the substrate voltage supply is connected to the substrate so as to apply different potentials for each of a light receiving period and a no-light receiving period. In addition, the reading electrode is formed on the upper portion of the reading channel, thereby forming the electrode wirings applying the reading pulse after a first exposure period and a second exposure period having a different period of time from the first exposure period. In this way, the solid-state imaging device 1 shown in FIG. 2 is formed.

In addition, although it is not shown in the drawings, a desired wiring layer, a planarization layer, a color filter, an on-chip lens, or the like is formed on the light shielding layer 31 as in the layer of the solid-state imaging device of the related art, thereby obtaining the solid-state imaging device 1 according to this embodiment.

In this embodiment, an example is described in which the semiconductor well layer 13 is formed by the P⁻-type epitaxial layer, but the semiconductor well layer 13 may be formed by the N⁻-type epitaxial layer. In this case, the P-type impurities are injected through ion injection into the N⁻ type epitaxial layer so as to include plural pixels 7 arranged in a matrix shape, thereby forming the P well (corresponding to the semiconductor well layer 13). In addition, in order to realize the function of the profile of the P⁻ region constituting the light receiving portion 2, the configuration may be different from that of this embodiment.

The electronic shutter adjusting layer 14 may be formed in such a manner that the semiconductor well layer 13 is formed and a high concentration of N-type impurities is injected through ion injection in a high energy state. In addition, in this embodiment, the electronic shutter adjusting layer 14 is formed to be embedded in the semiconductor substrate 12, but may be formed to contact with the semiconductor substrate 12.

In this embodiment, an example is described in which the first and second dark current suppressing portions 18 and 23 are simultaneously formed, but the first and second dark current suppressing portions 18 and 23 may be separately formed or may be formed after the vertical transmission electrode 28 is formed.

In this embodiment, an example is described in which the gate insulation layer 29 is formed on the entire surface of the semiconductor well layer 13, but the gate insulation layer 29 on the vertical transmission channel 25 and the reading channel 27 may be formed separately from an insulation layer formed on the light receiving portion 2 or the storage capacitor 8.

The light receiving portion 2 or the storage capacitor 8 may be formed after the process shown in FIG. 5E.

1.4 Method of Driving Solid-State Imaging Device

Next, a method of driving the solid-state imaging device 1 according to this embodiment will be described. First, prior to the case of actually driving the solid-state imaging device 1 according to this embodiment, the principle of generating and storing the signal charge in the light receiving portion 2 and the storage capacitor 8 will be described with reference to FIG. 3A.

As shown in FIG. 3A, in the case where the substrate voltage Vsub is set to Low, in the potential Val taken along the line A-A', the potential of the N⁻ region 17 is deeper than that of the P⁻ region 16 or the semiconductor well layer 13. In addition, in the case where the substrate voltage Vsub is Low, although it is not shown in the drawings, the potential taken along the line B-B' is substantially equal to the potential Val taken along the line A-A'. Further, the potential Vc taken along the line C-C' forms a well having a potential deeper than that of the light receiving portion 2 by the effect of the connection face between the P⁺ region 21 and the N region 22 constituting the storage capacitor 8.

For this reason, when the substrate voltage Vsub is set to Low, the signal charge generated in the light receiving portion 2 is discharged and transmitted to the storage capacitor 8 so as to be stored and maintained in the storage capacitor 8 without being stored in the light receiving portion 2. In this embodiment, the period in which the substrate voltage Vsub is Low is set to the "light receiving period".

Next, in the case where the substrate voltage Vsub is set to High, the potential Vah of the substrate taken along the line A-A' is pulled toward the deep side as a whole since the electronic shutter adjusting layer 14 includes the N-type high concentration impurity region. In addition, since the electronic shutter adjusting layer 14 is not formed in a portion taken along the line B-B', the potential is just slightly deep toward the semiconductor substrate 12, and hence the potential Vbh in the vicinity of the light receiving portion is not changed as in the case where the substrate voltage Vsub is Low.

For this reason, when the substrate voltage Vsub is set to High, the signal charge generated in the light receiving portion 2 is not transmitted to the storage capacitor 8 since the potential Vah taken along the line A-A' is deeper than the potential Vbh taken along the line B-B'. In addition, the potential Vah taken along the line A-A' is deep toward the semiconductor substrate 12 since the barrier of the P⁻-type semiconductor well layer 13 is pressed by the effect of the electronic shutter adjusting layer 14. For this reason, the signal charge generated in the light receiving portion 2 is swept toward the semiconductor substrate 12. That is, in the case where the substrate voltage Vsub is set to High, the signal charge generated by the photoelectric conversion of the light receiving portion 2 does not flow into the storage capacitor 8, and is swept toward the semiconductor substrate 12. In this embodiment, the period in which the substrate voltage Vsub is High is set to the "no-light receiving period".

In addition, at this time, the potential in the vicinity of the light receiving portion 2 among the potential Vbh taken along the line B-B' is substantially maintained to a value when the substrate voltage Vsub is Low by the effect of the offset region 24. Accordingly, the signal charge stored and maintained in the storage capacitor 8 does not reversely flow to the light receiving portion 2. Further, accordingly, even when the substrate voltage Vsub is changed to High, the signal charge stored in the storage capacitor 8 is capable of maintaining the signal charge amount up to the vicinity of a position where the potential Vc is shallow in the light receiving portion 2.

On the basis of the principle of the generation and storage of the signal charge, the method of driving the solid-state imaging device according to this embodiment will be described with reference to FIGS. 6 to 8. FIG. 6 is a driving timing chart of the solid-state imaging device 1 according to this embodiment. In addition, FIGS. 7A to 7B and 8C to 8E schematically show the potential well of the vertical transmission register 3, the reading gate portion 26, the storage capacitor 8, and the light receiving portion 2 for one pixel in the solid-state imaging device 1 according to this embodiment, and schematically show the case where the signal charge is transmitted. In FIGS. 7A to 7B and 8C to 8E, the same reference numerals will be given to the same constituents as those in FIG. 2, and the description thereof will be omitted.

First, the light receiving period is started by setting the substrate voltage Vsub to Low. In accordance with the start of the light receiving period, a short second exposure during a first exposure period T is started in the light receiving portion 2. In the short second exposure, as shown in FIG. 7A, signal charges 32a generated by the photoelectric conversion of light L incident to the light receiving portions 2 are discharged and transmitted to the storage capacitor 8, and are stored and held therein since the substrate voltage Vsub is Low. Accordingly, in all pixels of the solid-state imaging device 1, the signal charges 32a simultaneously generated by the photoelectric conversion in the light receiving portions 2 are stored and held in the storage capacitors 8.

Next, the short second exposure ends by applying a reading pulse φVt to the reading electrodes 28a. In accordance with the application of the reading pulse φVt, as shown in FIG. 7B, in all pixels, the signal charges 32a stored in the storage capacitors 8 during the short second exposure are simultaneously read to the vertical transmission channels 25. After the reading pulse is turned off, when the vertical transmission pulse φV is applied to the vertical transmission electrodes 28, the signal charges of all pixels are simultaneously transmitted in the vertical direction. In addition, at this time, since the substrate voltage Vsub is Low, a long second exposure during a second exposure period 2T (>T) starts at the same time when the short second exposure ends. As shown in FIG. 8C, during the long second exposure, signal charges 32b generated by the photoelectric conversion of light L are discharged and transmitted to the storage capacitors 8. That is, in the case where the substrate voltage Vsub is Low, the signal charges 32b generated in the light receiving portions 2 are occasionally transmitted to the storage capacitors 8. For this reason, the long second exposure starts immediately after a period of 1 μs in which the reading pulse φVt is applied to read the signal charges 32a generated by the short second exposure.

Subsequently, a long second exposure ends by setting the substrate voltage Vsub to High, and the no-light receiving period starts. When the substrate voltage Vsub is set to High, as shown in FIG. 8D, the signal charges 32 generated in the light receiving portions 2 during the no-light receiving period are swept toward the semiconductor substrate 12 so as not to be stored in the storage capacitors 8. That is, when the substrate voltage Vsub is set to High, the no-light receiving period starts, and the long second exposure for all pixels ends.

Then, after all the signal charges 32a generated by the short second exposure are vertically transmitted, the reading pulse φVt is applied, and as shown in FIG. 8E, the signal charges 32b generated by the long second exposure are simultaneously read to the vertical transmission channels 25. In addition, in accordance with the application of the vertical transmission pulse φV, in all pixels, the signal charges 32b are simultaneously transmitted in the vertical direction.

In this embodiment, in the signal charges 32b generated by the long second exposure, the signal charges are stored and held in the storage capacitors during a period a (FIG. 6) until the reading pulse φVt is applied so as to read the signal charges 32b generated by the long second exposure after the short second exposure. In addition, after all the signal charges 32a generated by the short second exposure are transmitted in the vertical direction, when the reading pulse φVt is applied, the signal charges 32b generated by the long second exposure are read to the vertical transmission channels 25. That is, even when the timing at which the vertical transmission of the signal charges 32a generated by the short second exposure ends is later than the timing at which the long second exposure ends, the signal charges 32b generated by the long second exposure are stored and held in the storage capacitors 8.

The signal charges 32a and 32b transmitted in the vertical direction by the vertical transmission registers 3 are transmitted in the horizontal direction by the horizontal transmission register 4, and are output as image signals through the output circuit 5. In addition, in this embodiment, the vertical transmission and the horizontal transmission of the signal charges generated by the short second exposure are sequentially performed every horizontal line. For this reason, after the signal charges generated by the short second exposure are read by the output portion, the signal charges generated by the long second exposure are read to the vertical transmission channels, thereby performing the vertical transmission or the horizontal transmission.

In the solid-state imaging device 1 according to this embodiment, in the case where an image of a moving image is captured, the short second exposure and the long second exposure of the next field are repeatedly performed by setting the substrate voltage Vsub to Low again.

In the solid-state imaging device 1 according to this embodiment, when the signals obtained by the short second exposure and the long second exposure are calculated, a wide dynamic range of signals are obtained.

Figure 11:
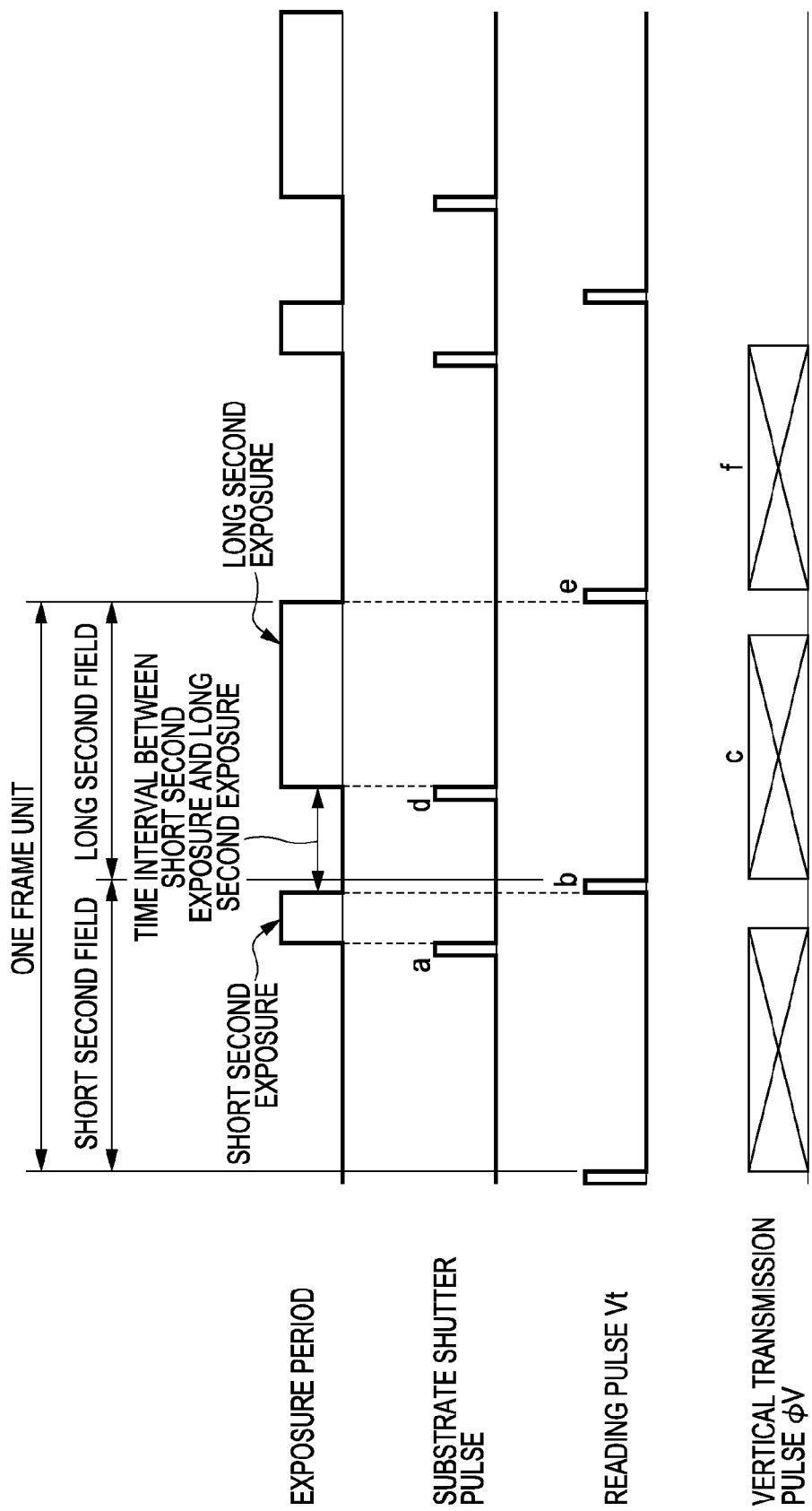
FIG. 11 is a driving timing chart of the solid-state imaging device of the related art.

In the solid-state imaging device of the related art, as shown in FIG. 11, since the timing at which the long second exposure ends is determined by the application of the reading pulse, the long second exposure is performed in accordance with the timing at which the reading pulse is applied. When the long second exposure is shorter than a period of one field, a time interval between the short second exposure and the long second exposure is large. In this embodiment, the signal charges obtained by the long second exposure are stored and held in the storage capacitor 8 during a period a until the next reading pulse is applied after the long second exposure ends. For this reason, the timing of the long second exposure may be independent from the timing of the reading pulse.

In the solid-state imaging device 1 according to this embodiment, since the substrate voltage Vsub is set to Low during a period in which the short second exposure and the long second exposure are performed, it is possible to discharge and transmit the signal charges generated by the light receiving portions 2 to the storage capacitors 8. In addition, the time interval between the short second exposure and the long second exposure may be set to several μs of period in which the reading pulse is applied after the short second exposure. That is, compared with the solid-state imaging device of the related art, it is possible to shorten the time interval between the short second exposure and the long second exposure by the period a in which the signal charges are stored in the storage capacitor. Even during a period in which the reading pulse is applied, since the substrate voltage Vsub is Low, the signal charges generated in the light receiving portions 2 are transmitted to the storage capacitors 8, and hence the time interval between the short second exposure and the long second exposure substantially does not exist. For this reason, even in the case where the image of the moving object is captured, the deviation in the image is reduced, and hence it is possible to appropriately calculate a wide dynamic range of signals.

Figure 7A:
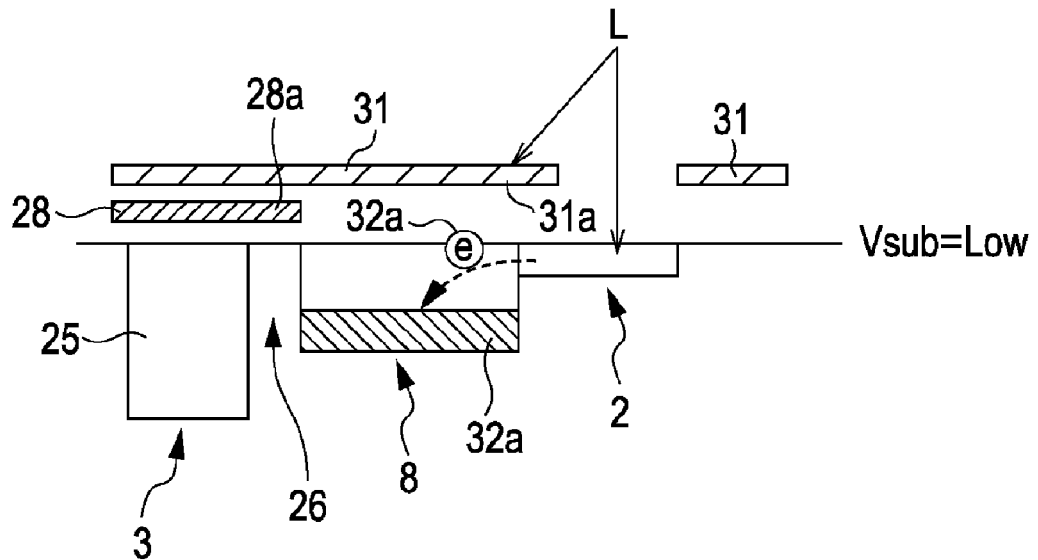
FIGS. 7A and 7B are (first) diagrams showing a case where a signal charge is transmitted upon driving the solid-state imaging device according to the first embodiment of the invention.

As shown in FIGS. 7A and 8C, since the signal charges 32a and 32b generated by the light receiving portions 2 are discharged and transmitted to the storage capacitors 8, it is not necessary to provide a transmission electrode between each light receiving portion 2 and each storage capacitor 8, and to simplify the structure. For this reason, it is possible to obtain a large area of a channel of the light receiving portion 2 or the storage capacitor 8, and thus to increase the sensitivity or the dynamic range. In addition, since there is no transmission electrode between the light receiving portion 2 and the storage capacitor 8, the boundary face of the substrate formed of silicon is not depleted during the transmission of the signal charge, and hence it is possible to suppress a dark current from increasing.

In addition, in the light receiving portion 2, it is necessary to extend the depletion layer in order to ensure the spectral sensitivity characteristic, and a position having a deep electrostatic potential is easily set to a deep position of the surface of the substrate. Incidentally, since the storage capacitor 8 is capable of storing and holding the signal charge, it is possible to set a position having the deepest electrostatic potential to a shallow position of the surface of the substrate, and thus to easily decrease the reading voltage.

Further, in the solid-state imaging device of the related art, the signal charge is generated and stored in the light receiving portion. In the solid-state imaging device 1 according to this embodiment, since the signal charge is not stored in the light receiving portion 2, it is possible to make the electrostatic potential of the light receiving portion 2 to be shallow by several volts than that of the light receiving portion storing the signal charge of the related art. Accordingly, it is possible to reduce the maximum electric field of the light receiving portion 2. Therefore, it is possible to reduce an increase in dark current caused by the electric field.

In the solid-state imaging device 1 according to this embodiment, the light receiving portion 2 and the storage capacitor 8 are provided with the first and second dark current suppressing portions 18 and 23 through the HAD structure, and the surface is normally filled with electron holes. For this reason, it is possible to suppress a dark current generated in a boundary face of an oxide layer forming the gate insulation layer 29 or silicon forming the substrate.

According to this embodiment, the storage capacitor 8 is shielded by the light shielding layer 31. Accordingly, as shown in FIGS. 6, 7A, and 7B, it is possible to prevent the photoelectric conversion caused by light L passing through the storage capacitor 8 during the light receiving period and before and after the light receiving period.

According to this embodiment, the light shielding layer 31 is formed to have the protrusion 31a protruding from the storage capacitor 8 toward the light receiving portion 2. For this reason, since the substrate voltage Vsub is High, even after the light receiving period ends, it is possible to suppress light incident to the vicinity of the storage capacitor 8 among incident light L from entering the storage capacitor 8 as a kind of smear.

According to this embodiment, as shown in FIG. 2, since the lower portion of the N region 22 constituting the storage capacitor 8 is provided with a comparatively high concentration $P^+$ region 21, it is possible to increase the capacity of the depletion layer formed in the connection face between the N region 22 and the $P^+$ region 21. Accordingly, it is possible to suppress smear from being mixed in the storage capacitor 8.

2. Second Embodiment

Figure 7B:
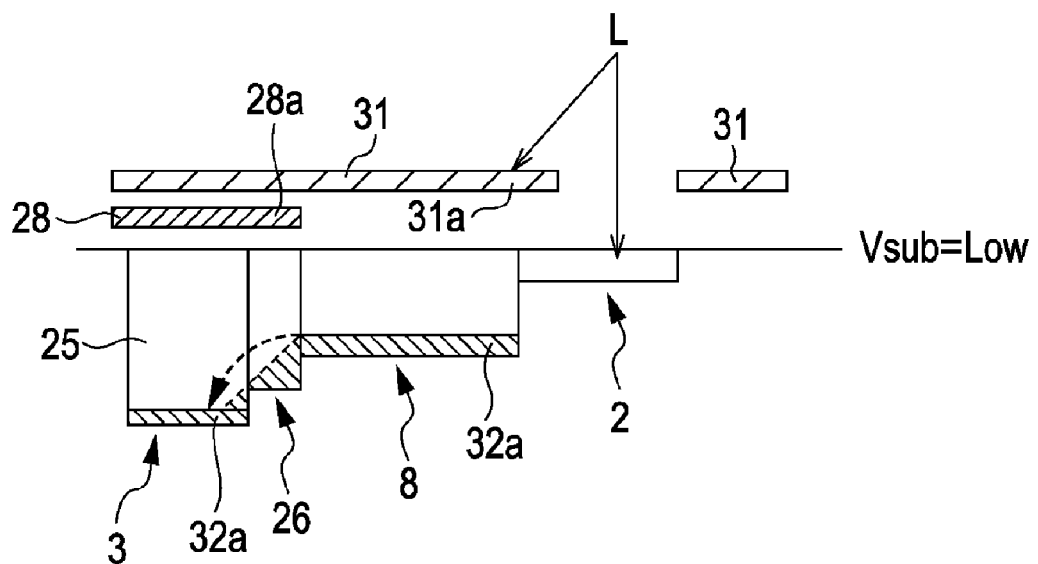

FIGS. 7A and 7B show a schematic sectional configuration of the solid-state imaging device according to a second embodiment of the invention. In FIGS. 7A and 7B, the same reference numerals will be given to the same constituents as those of FIG. 2, and the description thereof will be omitted.

A solid-state imaging device 41 according to this embodiment is an example in which a part of the second dark current suppressing portion of the solid-state imaging device according to the first embodiment is modified.

In this embodiment, a second dark current suppressing portion 44 of the storage capacitor 8 includes a dark current suppressing electrode 42 and a DC voltage supply 43. The dark current suppressing electrode 42 is formed on the upper portion of the storage capacitor 8 of the semiconductor well layer 13 with the gate insulation layer 29 interposed therebetween.

Even in the solid-state imaging device 41, the potentials taken along the line A-A', B-B', and C-C' in FIGS. 7A and 7B have the same profiles as those in FIG. 3A as described in the first embodiment.

In addition, the second dark current suppressing portion 44 of the solid-state imaging device 41 may be formed in such a manner that the second dark current suppressing portion 23 is not formed in the process shown in FIG. 5E, but the dark current suppressing electrode 42 is formed in the process shown in FIG. 5E in the manufacturing method according to the first embodiment. The other manufacturing processes are the same as those of the first embodiment.

In the solid-state imaging device 41 according to this embodiment, since a negative bias voltage is normally applied to the dark current suppressing electrode 42 by the DC voltage supply 43, the surface of the N region 22 constituting the storage capacitor 8 is inverted so as to be filled with electron holes. Accordingly, since the dark current generated in the boundary face of the storage capacitor 8 is subjected to the recombination in the electron holes, it is possible to suppress the dark current in the storage capacitor 8. In this embodiment, a configuration is described in which a negative bias voltage is applied to the dark current suppressing electrode 42, but the dark current suppressing electrode 42 may be electrically connected to the light shielding layer 31 so as to apply a negative voltage to the dark current suppressing electrode 42 and the light shielding layer 31. Accordingly, it is possible to simplify a wiring for applying a negative voltage to each of the pixels.

Even in the solid-state imaging device 41 according to this embodiment, it is possible to drive the solid-state imaging device 41 through a method which is the same as the method of driving the solid-state imaging device 1 according to the first embodiment. Even in this embodiment, it is possible to shorten the time interval between the short second exposure and the long second exposure. For this reason, since the deviation in the image is reduced even in the case where an image of a moving object is captured, it is possible to appropriately calculate a wide dynamic range of signals. In addition, it is possible to obtain the same advantages as those of the first embodiment.

In the above-described first and second embodiments, a configuration is described in which the first conduction type is set to an N type and the second conduction type is set to a P type, but the first conduction type may be a P type, and the second conduction type may be an N type. In this case, a desired pulse applied to the solid-state imaging device is a pulse having polarity opposite to that of the above-described example.

The invention is not limited to the application to the solid-state imaging device, but may be applied to an imaging device. Here, the imaging device indicates a camera system such as a digital still camera or a video camera or an electronic device having an imaging function such as a cellular phone. In addition, the camera module mounted to the electronic device may be used as an imaging device. Hereinafter, an electronic apparatus using the solid-state imaging device according to the embodiments of the invention will be described.

3. Third Embodiment

Figure 9:
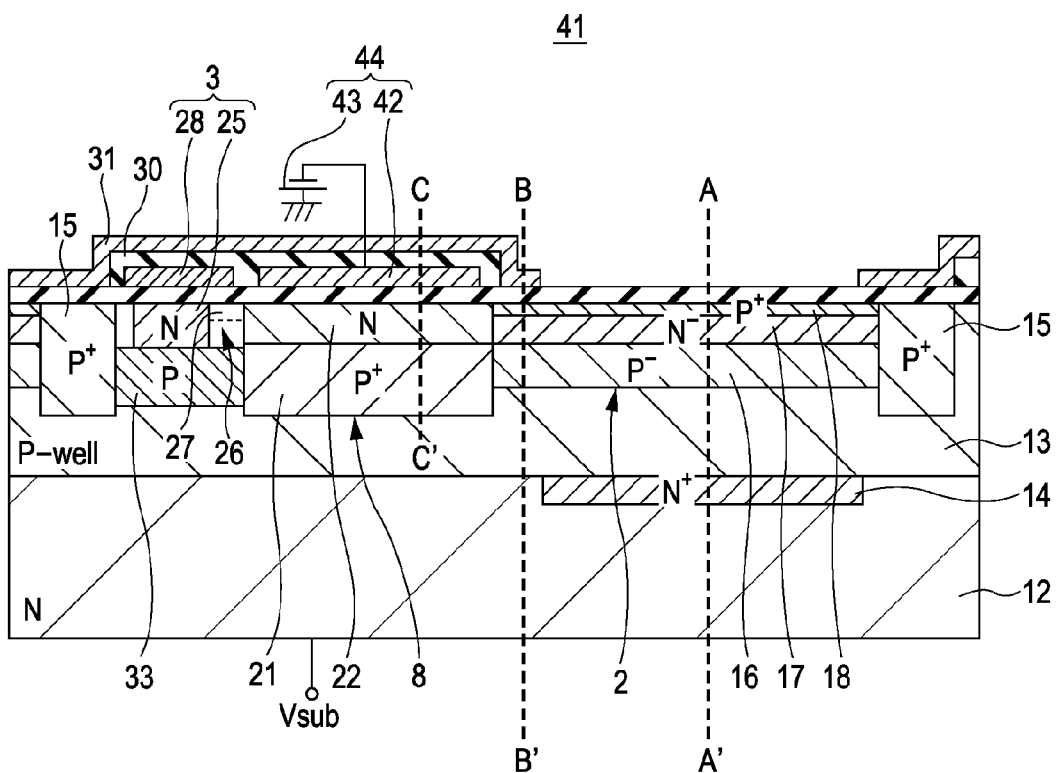
FIG. 9 is a schematic sectional view of the solid-state imaging device according to a second embodiment of the invention.
Figure 10:
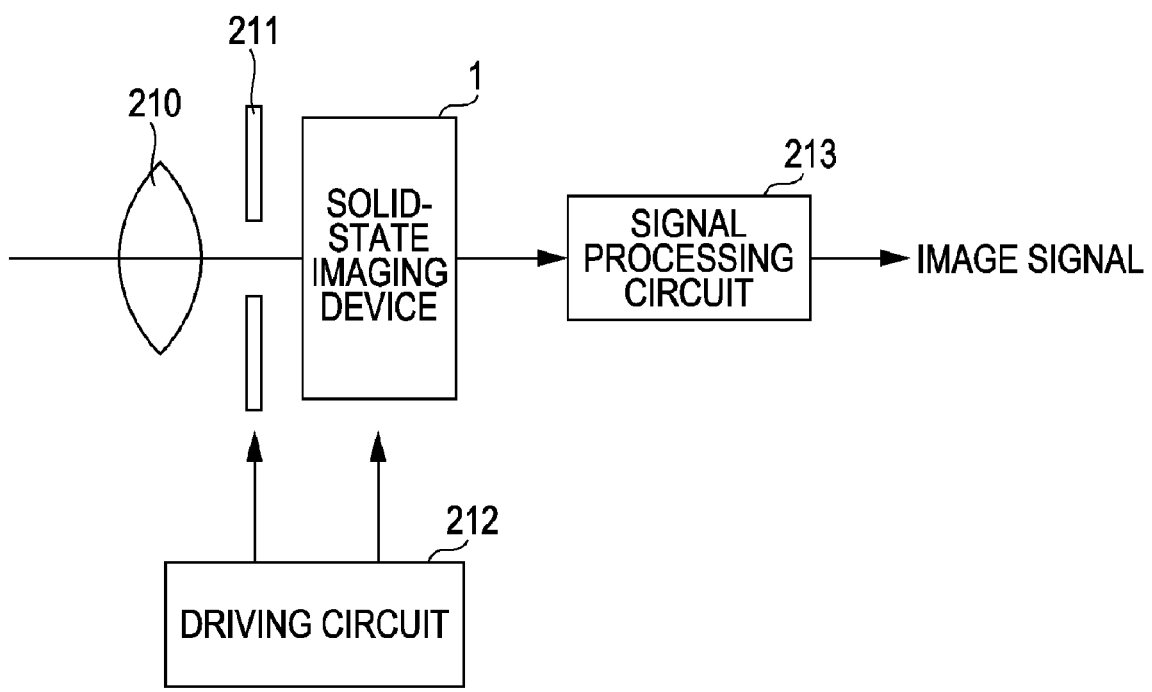
FIG. 10 is a schematic configuration diagram of an electronic apparatus according to a third embodiment of the invention.

FIG. 9 shows a schematic configuration of an electronic apparatus 200 according to a third embodiment of the invention. The electronic apparatus 200 according to this embodiment is an application example in which the solid-state imaging device 1 according to the first embodiment of the invention is applied to a camera.

The schematic sectional configuration of the electronic apparatus 200 according to this embodiment is shown in FIG. 9. In the electronic apparatus 200 according to this embodiment, a digital still camera capable of capturing a still image is exemplified, but the invention is not limited to the still image.

The electronic apparatus 200 according to this embodiment includes the solid-state imaging device 1, an optical lens 210, a driving circuit 212, and a signal processing circuit 213.

The optical lens 210 forms image light (incident light) obtained from an object on an imaging surface of the solid-state imaging device 1. Accordingly, the signal charge is stored in the solid-state imaging device 1 during a predetermined period.

The driving circuit 212 supplies a transmission operation signal of the solid-state imaging device 1. In accordance with the driving signal (timing signal) supplied from the driving circuit 212, the signal transmission of the solid-state imaging device 1 is performed. The signal processing circuit 213 performs various signal processes. Although it is not shown in the drawing, the signal processing circuit 213 is provided with a calculation process circuit for outputting a wide dynamic range of signals by using the signal charge obtained by the short second exposure and the signal charge obtained by the long second exposure. The image signal subjected to the signal process is stored in a storage medium such as a memory or is output to a monitor.

In the electronic apparatus 200 according to this embodiment, it is possible to obtain a wide dynamic range of images by using the signals obtained by the short second exposure and the long second exposure in the solid-state imaging device. In addition, since the time interval between the short second exposure and the long second exposure is shortened, it is possible to appropriately calculate a wide dynamic range of signals even in the case where an image of a moving object is captured, and thus to improve the quality of the image.

As an electronic apparatus capable of adopting the solid-state imaging device 1, the invention is not limited to the digital still camera, but may be applied to an imaging device for capturing a still image or a moving image, such as a camera module for a mobile device such as a digital still camera or a cellular phone.

In this embodiment, a configuration is described in which the solid-state imaging device 1 is applied to the electronic apparatus, but the solid-state imaging device according to the second embodiment may be used.

The present application contains subject matter related to that disclosed in Japanese Priority Patent Application JP 2009-025348 filed in the Japan Patent Office on Feb. 5, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a substrate;
    a substrate voltage supply applying a first potential to the substrate during a light receiving period including first and second exposure periods different from each other and applying a second potential to the substrate during a no-light receiving period; and
    a plurality of pixels each including
        a light receiving portion formed on a front surface side of the substrate and generating a signal charge in accordance with received light,
        a storage capacitor formed adjacent to the light receiving portion so that the signal charge generated in the light receiving portion is transmitted thereto and is stored and held therein when the first potential is applied to the substrate,
        dark current suppressing portions formed in the light receiving portion and the storage capacitor,
        an electronic shutter adjusting layer formed in a region facing the light receiving portion in the substrate and distant from the storage capacitor by a predetermined offset region, and adjusting a potential distribution of the substrate so that the signal charge generated in the light receiving portion is swept toward a rear surface side of the substrate when the second potential is applied to the substrate,
        a reading gate portion reading the signal charge stored in the storage capacitor after the first and second exposure periods, and
        a vertical transmission register transmitting the signal charge read by the reading gate portion in the vertical direction.

2. The solid-state imaging device according to claim 1, wherein the substrate includes a first conduction type semiconductor substrate and a second conduction type semiconductor well layer formed on the semiconductor substrate, wherein the light receiving portion includes a connection face between first and second conduction type impurity regions and is formed on the semiconductor well layer, wherein the storage capacitor includes a connection face between the first and second conduction type impurity regions, and wherein the electronic shutter adjusting layer is formed in the first conduction type impurity region between the semiconductor substrate and the semiconductor well layer.

3. The solid-state imaging device according to claim 1, wherein the signal charge reading operation after the first and second exposure periods is simultaneously performed in all pixels.

4. The solid-state imaging device according to claim 2, wherein an electrostatic potential of the storage capacitor is deeper than that of the light receiving portion.

5. The solid-state imaging device according to claim 4, wherein an electrostatic potential of a region between the light receiving portion and the storage capacitor above the offset region is substantially maintained to the same value during the light receiving period and the no-light receiving period.

6. The solid-state imaging device according to claim 5, wherein a light-incident-side upper portion of the storage capacitor is provided with a light shielding layer, and an end of the light shielding layer is provided with a protrusion protruding toward the light receiving portion.

7. The solid-state imaging device according to claim 6, wherein the light shielding layer is formed even on an upper portion of the vertical transmission register.

8. The solid-state imaging device according to claim 7, wherein the light shielding layer is formed to shield a region excluding a channel region of the light receiving portion.

9. The solid-state imaging device according to claim 6, wherein the dark current suppressing portions of the light shielding portion and the storage capacitor include the second conduction type impurity regions formed on light-incident-side front surfaces of the light receiving portion and the storage capacitor.

10. The solid-state imaging device according to claim 6, wherein the dark current suppressing portion of the light receiving portion includes the second conduction type impurity region formed on a light-incident-side front surface of the light receiving portion, and wherein the dark current suppressing portion of the storage capacitor includes a dark current suppressing electrode formed on the light-incident-side upper portion of the storage capacitor and a DC voltage supply applying a DC voltage to the dark current suppressing electrode.

11. The solid-state imaging device according to claim 10, wherein the dark current suppressing electrode is electrically connected to the light shielding layer.

12. A method of driving a solid-state imaging device including: a substrate; a substrate voltage supply applying a first potential to the substrate during a light receiving period including first and second exposure periods different from each other and applying a second potential to the substrate during a no-light receiving period; and a plurality of pixels each including: a light receiving portion formed on a front surface side of the substrate and generating a signal charge in accordance with received light; a storage capacitor formed adjacent to the light receiving portion so that the signal charge generated in the light receiving portion is transmitted thereto and is stored and held therein when the first potential is applied to the substrate; dark current suppressing portions formed in the light receiving portion and the storage capacitor; an electronic shutter adjusting layer formed in a region facing the light receiving portion in the substrate and distant from the storage capacitor by a predetermined offset region, and adjusting a potential distribution of the substrate so that the signal charge generated in the light receiving portion is swept toward a rear surface side of the substrate when the second potential is applied to the substrate; a reading gate portion reading the signal charge stored in the storage capacitor after the first and second exposure periods; and a vertical transmission register transmitting the signal charge read by the reading gate portion in the vertical direction, the method comprising the steps of:

starting a first exposure period by applying a first potential from the substrate voltage supply to the substrate so that the signal charge generated in the light receiving portion starts to be transmitted to the storage capacitor;

subsequently starting a second exposure period after ending the first exposure period by allowing the reading gate portion to read the signal charge stored in the storage capacitor during the first exposure period; and sweeping the signal charge generated in the light receiving portion toward the substrate after ending the second exposure period by applying a second potential from the substrate voltage supply to the substrate.

13. The method according to claim 12,
wherein operations of starting and ending the light receiving period and an operation of reading the signal charge from the storage capacitor are simultaneously performed in the light receiving portions of all pixels formed on the substrate.

14. An electronic apparatus comprising:
an optical lens;
a substrate voltage supply applying a first potential to the substrate during a light receiving period including first and second exposure periods different from each other and applying a second potential to the substrate during a no-light receiving period;
a solid-state imaging device receiving light collected by the optical lens and including
a light receiving portion formed on a front surface side of the substrate and generating a signal charge in accordance with received light,
a storage capacitor formed adjacent to the light receiving portion so that the signal charge generated in the light receiving portion is transmitted thereto and is stored and held therein when the first potential is applied to the substrate,
dark current suppressing portions formed in the light receiving portion and the storage capacitor,
an electronic shutter adjusting layer formed in a region facing the light receiving portion in the substrate and distant from the storage capacitor by a predetermined offset region, and adjusting a potential distribution of the substrate so that the signal charge generated in the light receiving portion is swept toward a rear surface side of the substrate when the second potential is applied to the substrate,
a reading gate portion reading the signal charge stored in the storage capacitor after the first and second exposure periods, and
a vertical transmission register transmitting the signal charge read by the reading gate portion in the vertical direction, and
a signal processing circuit processing an output signal output from the solid-state imaging device.

15. The electronic apparatus according to claim 14, further comprising:
   a calculation processing circuit performing a wide dynamic range of calculation by using the signal charge stored after the first exposure period and the signal charge stored after the second exposure period.

* * * * *